(12) United States Patent
Wu et al.

(10) Patent No.: US 7,064,954 B1
(45) Date of Patent: Jun. 20, 2006

(54) MAINFRAME COOLING STRUCTURE

(75) Inventors: Chia-Chuan Wu, Taipei (TW);
Chia-Yen Hsu, Taipei (TW);
Chuan-Chun Chiu, Taipei (TW)

(73) Assignee: Datavan Internatoinal Corp., Taipei Hsien (TW)

( * ) Notice: Subject to any disclaimer, the term of this patent is extended or adjusted under 35 U.S.C. 154(b) by 0 days.

(21) Appl. No.: 10/907,862

(22) Filed: Apr. 19, 2005

(51) Int. Cl.
*H05K 7/20* (2006.01)

(52) U.S. Cl. ..................... 361/695; 361/697; 174/16.3; 165/80.3

(58) Field of Classification Search ................. 361/695, 361/697, 719; 165/80.3, 104.33, 122; 174/16.1, 174/16.3; 454/184
See application file for complete search history.

(56) References Cited

U.S. PATENT DOCUMENTS

| 5,946,188 | A | * | 8/1999 | Rochel et al. | ............... 361/690 |
| 5,991,153 | A | * | 11/1999 | Heady et al. | ............... 361/704 |
| 6,735,081 | B1 | * | 5/2004 | Bishop et al. | ............... 361/695 |
| 6,804,115 | B1 | * | 10/2004 | Lai | ............................ 361/695 |

* cited by examiner

*Primary Examiner*—Boris Chérvinsky

(57) ABSTRACT

A mainframe cooling structure is disclosed to include a body, which has a side cover and a ventilation grille at the side cover for letting air in and out, a circuit board, which is fixedly mounted inside the body and has an electronic device that produces heat during operation, and a cooler module, which includes a heat sink attached to the electronic device, a fan holder provided at the top side of the heat sink, and two fans mounted in the fan holder and aimed at different parts of the ventilation grille for drawing outside cooling air toward the heat sink and drawing inside hot air out of the body.

8 Claims, 5 Drawing Sheets

__US 7,064,954 B1__

MAINFRAME COOLING STRUCTURE

BACKGROUND OF THE INVENTION

1. Field of the Invention

The present invention relates to coolers and more particularly, to a mainframe cooling structure, which uses two reversed fans to draw outside cooling air toward the heat sink and to draw inside hot air away from the space around the heat sink to the outside open space.

2. Description of the Related Art

Following fast development of computer technology, a variety of high-speed electronic devices (such as CPUs, ICs) have been created. These high-speed electronic devices release much heat energy during operation. In an Intel Developer Forum, Intel's CTO (Chief Technology Officer) Patrick Gelsinger cited the importance of cooling and power saving in the development of computer in the next decade. "Cooling" is quite important to the operation of an electronic device.

An electronic device may become unstable or fail when working under a high temperature environment. Frequently having an electronic device to work under a high temperature environment will shorten the service life of the electronic device. Therefore, the cooling method is an important factor in designing an electronic apparatus. A good cooling arrangement to an electronic device greatly improves the stability of the electronic device and its performance.

Conventionally, a fan is used with a heat sink for dissipating heat from an electronic device, for example, a CPU. The heat sink is adapted to absorb heat energy from the electronic device to which it is attached. The fan is adapted to induce currents of air for carrying heat energy away from the heat sink. However, this arrangement is still not satisfactory in function. Actually, the fan is designed to draw outside cooling air toward the heat sink to make a heat exchange, for enabling the heat sink to absorb more amount of heat energy from the electronic device. However, because of lacking in guide means to guide hot air away from the area round the heat sink, hot air may be accumulated in every corner around the heat sink, thereby increasing the working temperature of the electronic device. When the working temperature surpassed a certain level, the electronic device will become unstable, thereby shortening the service life of the electronic device.

Further, the cooler formed of a fan and a heat sink for use in the mainframe of a computer may be directly installed in the motherboard. However, because the motherboard is a thin flat board, the heat sink and or the fan may be forced away from the motherboard accidentally during delivery or a use of the computer, thereby causing damage to the motherboard or failure of the cooler.

SUMMARY OF THE INVENTION

The present invention has been accomplished under the circumstances in view. It is therefore the main object of the present invention to provide a mainframe cooling structure, which uses two reversed fans to produce a convection of air, thereby effectively dissipate heat from the electronic device. It is another object of the present invention to provide a mainframe cooling structure, which holds the fans and the heat sink firmly on the circuit board against displacement. To achieve these and other objects of the present invention, the mainframe cooling structure comprises a body, which has a side cover and a ventilation grille at the side cover for letting air in and out, a circuit board, which is fixedly mounted inside the body and has an electronic device that produces heat during operation, and a cooler module, which comprises a heat sink attached to the electronic device, a fan holder provided at the top side of the heat sink, and two fans mounted in the fan holder and aimed at different parts of the ventilation grille for drawing outside cooling air toward the heat sink and drawing inside hot air out of the body. Further, the ventilation grille of the side cover is pressed on the two fans, thereby holding down the fans and the heat sink on the electronic device at the circuit board.

DETAILED DESCRIPTION OF THE PREFERRED EMBODIMENT

Figure 1:
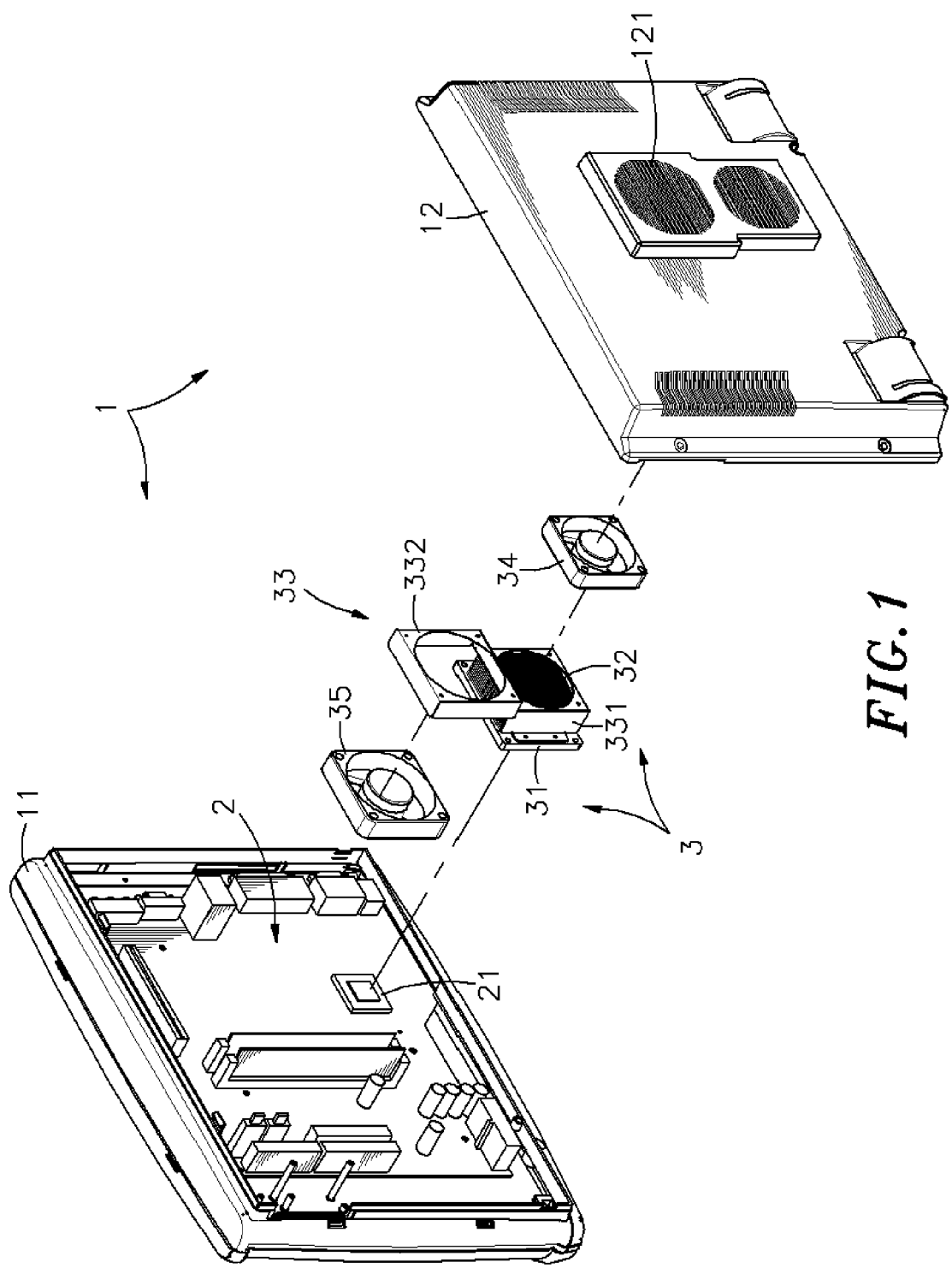
FIG. 1 is an exploded view of a mainframe cooling structure according to the present invention.

Referring to FIG. 1, a mainframe cooling structure in accordance with the present invention is shown comprised of a body 1, a circuit board 2, and a cooler module 3.

The body 1 comprises a hollow base 11 and a side cover 12. The side cover 12 has a ventilation grille 121 for letting air in and out.

The circuit board 2 has an electronic device 21.

The cooler module 3 comprises a thermoconductive base 31, a first heat sink 32 provided at the top side of the thermoconductive base 31, a fan holder 33, which comprises a first locating frame 331 covered over the first heat sink 32 and fastened to the thermoconductive base 31 and a second locating frame 332 extended from the first locating frame 331 at one side, a first fan 34 mounted on the first locating frame 331 and adapted to induce currents of air toward the first heat sink 32 and the thermoconductive base 31, and a second fan 35 mounted on the second locating frame 332 and adapted to induce currents of air in direction reversed to the currents of air induced by the first fan 34.

Figure 2:
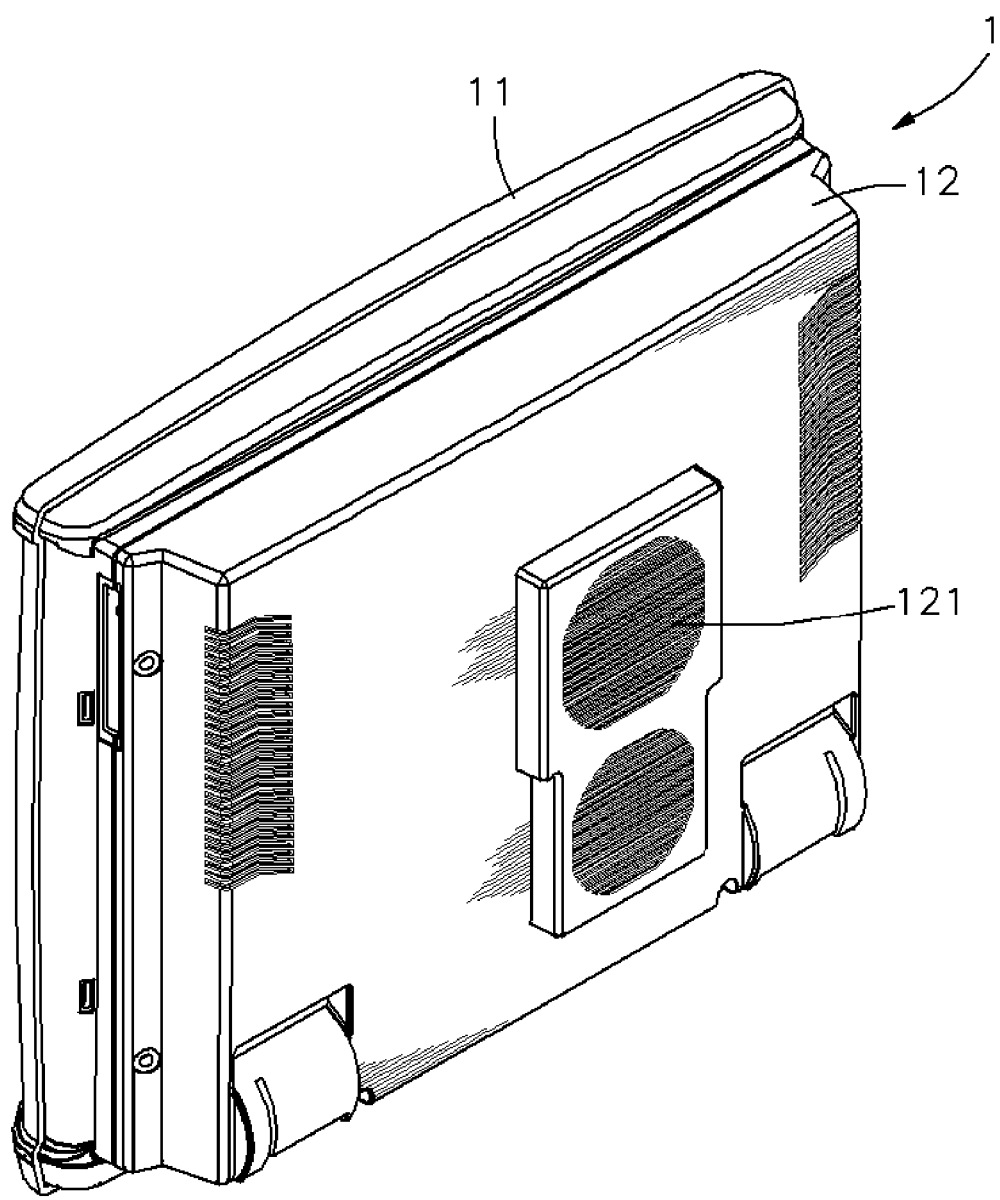
FIG. 2 is an elevational assembly view showing the outer appearance of the mainframe cooling structure according to the present invention.
Figure 3:
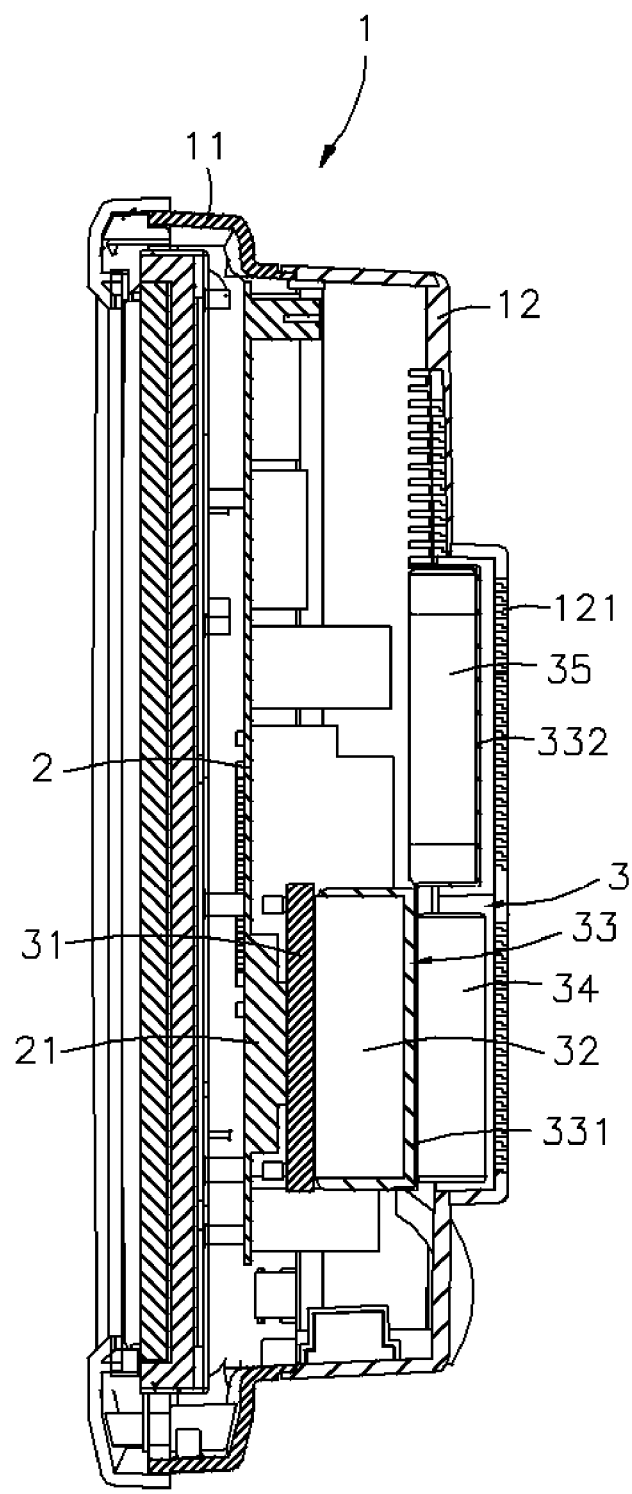
FIG. 3 is a sectional side view of the mainframe cooling structure according to the present invention.

Referring to FIGS. 2 and 3 and FIG. 1 again, the thermoconductive base 31 of the cooler module 3 is attached to the electronic device 21 at the circuit board 2 and firmly secured thereto with fastener means (not shown), and then the first fan 34 and the second fan 35 are respectively installed in the first locating frame 331 and the second locating frame 332 of the fan holder 33, and then the side cover 12 is fastened to the hollow base 11, keeping the ventilation grille 121 pressed on the first fan 34 and the second fan 35 to hold down the first fan 34, the second fan 35 and the first heat sink 32.

The mainframe in accordance with the present invention can be the mainframe of a touch screen display or computer. The electronic device 21 of the circuit board 2 can be a CPU, north bridge chip, or south bridge chip.

Figure 4:
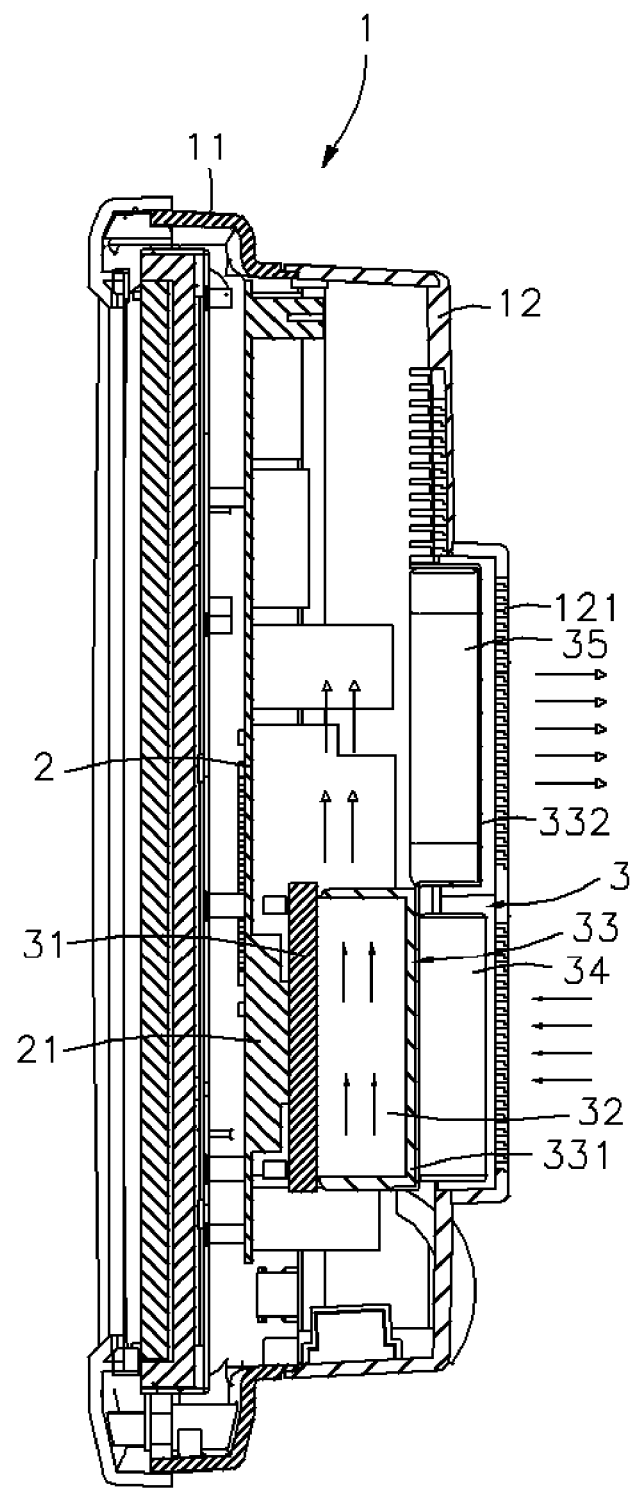
FIG. 4 is a schematic sectional view showing the mainframe cooling structure in operation.

Referring to FIG. 4, during operation, the first fan 34 draws outside cooling air from the outside space through the ventilation grille 121 toward the first heat sink 32 for heat exchange (see the solid arrowhead sign), and at the same time the second fan 35 draws inside hot air from the inside space of the body 1 to the outside open air through the ventilation grille 121 (see the hollow arrowhead sign). Because the first fan 34 and the second fan 35 are arranged in a parallel member and respectively aimed at a different part of the ventilation grille 121, outside cooling air can be continuously drawn into the inside of the body 1 toward the heat sink 32, and inside hot air can be continuously carried away from the space around the first heat sink 32 to the outside of the body 1, thereby lowering the working temperature of the electronic device 21. Therefore, the electronic device 21 functions stably under a stable working environment.

Figure 5:
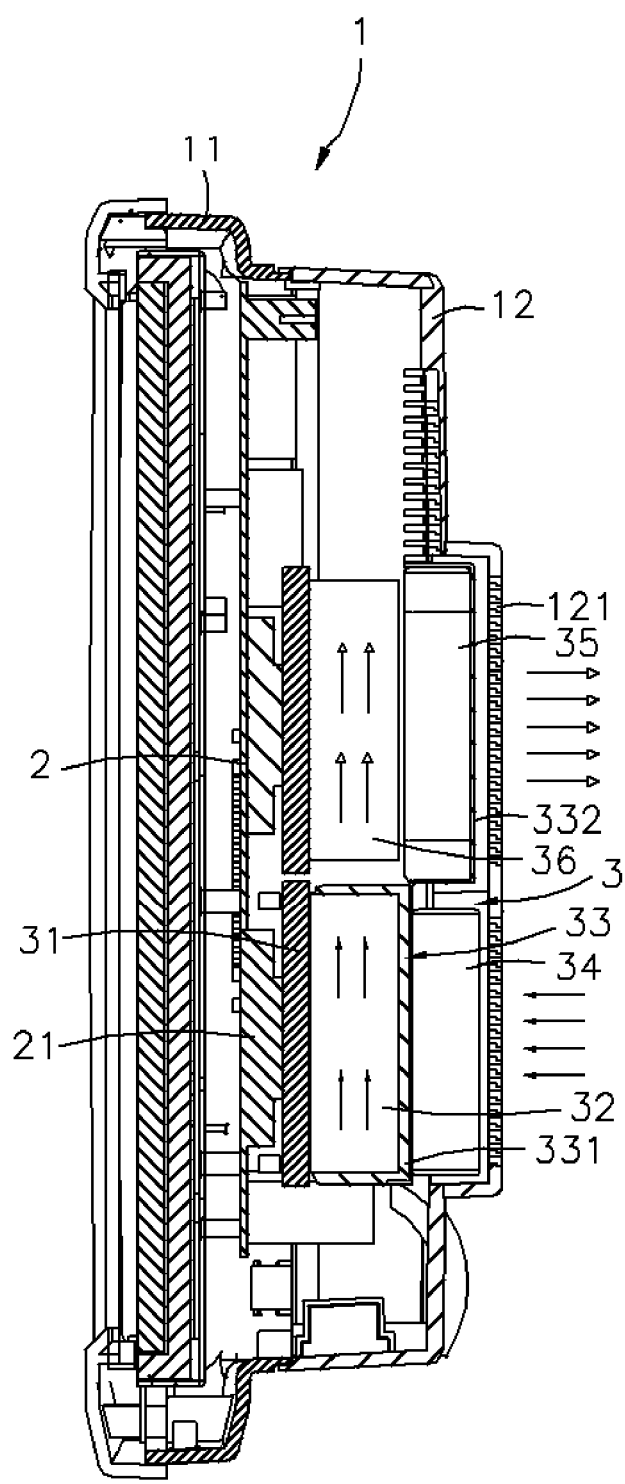
FIG. 5 is a sectional side view of an alternate form of the mainframe cooling structure according to the present invention.

FIG. 5 is a sectional view of an alternate form of the present invention. According to this embodiment, a second heat sink 36 is provided at the bottom side of the second fan 35. This second heat sink 36 can be attached to a second electronic device of the circuit board for absorbing heat from the second electronic device.

A prototype of mainframe cooling structure has been constructed with the features of FIGS. 1~5. The mainframe cooling structure functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A mainframe cooling structure comprising:
    a body, said body comprising a hollow base and a side cover covering one side of said hollow base, said side cover having a ventilation grille for letting air in and out;
    a circuit board fixedly mounted inside said body, said circuit board comprising an electronic device that produces heat when operating; and
    a cooler module fastened to said circuit board and adapted to dissipate heat from said electronic device, said cooler module comprising heat sink means attached to said electronic device, a fan holder provided at a top side of said heat sink means, a first fan mounted in said fan holder and aimed at a first part of said ventilation grille and adapted to induce currents of air toward said heat sink means, and a second fan mounted in said fan holder and aimed at a second part of said ventilation grille and adapted to induce currents of air in direction reversed to the currents of air induced by said first fan for dissipating heat away from said heat sink means.

2. The mainframe cooling structure as claimed in claim 1, wherein said fan holder comprises a first locating frame, which is covered over said heat sink means and carries said first fan, and a second locating frame, which extends from said first locating frame at one side and carries said second fan.

3. The mainframe cooling structure as claimed in claim 1, wherein said cooler module further comprises second heat sink means provided at a bottom side of said second fan.

4. The mainframe cooling structure as claimed in claim 1, wherein said body is the mainframe of a touch screen display.

5. The mainframe cooling structure as claimed in claim 1, wherein said body is the mainframe of a computer.

6. The mainframe cooling structure as claimed in claim 1, wherein said electronic device is a CPU (central processing unit).

7. The mainframe cooling structure as claimed in claim 1, wherein said electronic device is a north/south bridge chip.

8. The mainframe cooling structure as claimed in claim 1, wherein said ventilation grille of said side cover is pressed on said first fan and said second fan.

\* \* \* \* \*